United States Patent
Namkung et al.

(10) Patent No.: US 9,485,858 B2
(45) Date of Patent: Nov. 1, 2016

(54) FLEXIBLE DISPLAY DEVICE

(71) Applicant: SAMSUNG DISPLAY CO., LTD., Yongin, Gyeonggi-Do (KR)

(72) Inventors: Jun Namkung, Asan-si (KR); Soonryong Park, Sejong (KR); Chulwoo Jeong, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 335 days.

(21) Appl. No.: 14/298,792

(22) Filed: Jun. 6, 2014

(65) Prior Publication Data

US 2015/0146386 A1 May 28, 2015

(30) Foreign Application Priority Data

Nov. 28, 2013 (KR) .......................... 10-2013-0146426

(51) Int. Cl.
H05K 1/02 (2006.01)
G02F 1/1333 (2006.01)

(52) U.S. Cl.
CPC ......... H05K 1/028 (2013.01); G02F 1/133305 (2013.01); *H01L 2251/5338* (2013.01); *H05K 2201/055* (2013.01); *H05K 2201/09036* (2013.01); *H05K 2201/09845* (2013.01); *H05K 2201/10106* (2013.01); *H05K 2201/10128* (2013.01)

(58) Field of Classification Search
CPC ............ G02F 1/133305; H05K 1/028; H05K 2201/055; H05K 2201/09036
See application file for complete search history.

(56) References Cited

U.S. PATENT DOCUMENTS

| | | | |
|---|---|---|---|
| 7,242,398 B2* | 7/2007 | Nathan ............... | H01L 27/3244 345/206 |
| 9,048,443 B2* | 6/2015 | Namkung ........... | H01L 51/0097 |
| 9,196,848 B2* | 11/2015 | Namkung ........... | H01L 51/5237 |
| 9,274,559 B2* | 3/2016 | Prushinskiy ......... | G06F 1/1652 |
| 9,324,959 B2* | 4/2016 | Namkung ........... | H01L 51/0097 |
| 2014/0029212 A1* | 1/2014 | Hwang ................. | H05K 1/028 361/749 |
| 2014/0042406 A1* | 2/2014 | Degner ................ | H01L 27/326 257/40 |
| 2015/0014644 A1 | 1/2015 | Namkung et al. | |
| 2015/0227172 A1* | 8/2015 | Namkung ............. | G06F 1/1652 345/173 |
| 2015/0313004 A1* | 10/2015 | Namkung ............. | G06F 1/1652 361/749 |
| 2016/0007441 A1* | 1/2016 | Matsueda ............ | G06F 1/1652 361/749 |

FOREIGN PATENT DOCUMENTS

| | | | | |
|---|---|---|---|---|
| GB | 2197810 A | * | 6/1988 | ............. B21D 11/08 |
| JP | 2011-237661 | | 11/2011 | |
| KR | 10-2006-0123597 | | 12/2006 | |
| KR | 10-2013-0076402 | | 7/2013 | |
| KR | 10-2015-0007632 | | 1/2015 | |

* cited by examiner

*Primary Examiner* — Jeremy C Norris
*Assistant Examiner* — Nathan Milakovich
(74) *Attorney, Agent, or Firm* — Lewis Roca Rothgerber Christie LLP (57) ABSTRACT

A flexible display device including a flexible display panel including a folding area and a peripheral area, and a first outer member including a groove pattern is disclosed. The groove pattern includes a flat surface and inclined portions connected to the flat surface and symmetrical with each other about the flat surface.

17 Claims, 9 Drawing Sheets

FLEXIBLE DISPLAY DEVICE

CROSS-REFERENCE TO RELATED APPLICATION

This application claims priority to and the benefit of Korean Patent Application No. 10-2013-0146426 filed in the Korean Intellectual Property Office on Nov. 28, 2013, the entire content of which is incorporated herein by reference.

BACKGROUND

1. Field

Embodiments of the present disclosure relate to a display device. For example, embodiments of the present disclosure relate to a flexible display device.

2. Description of the Related Art

In recent years, a flexible display device, which is formed of a flexible material (e.g., plastic) to maintain display performance thereof even though it is bent in a manner similar to how paper is folded, has been actively researched. The flexible display device has been spotlighted as a next generation display device to replace various electronic equipment, such as a portable computer, an electronic newspaper, a smart card, a printed media, etc.

The flexible display device includes a flexible display panel. The flexible display panel includes a display area for displaying an image and a non-display area surrounding the display area. The non-display area includes various circuit parts and line parts to apply image signals to the display area and is positioned at the same (or substantially the same) plane as the display area.

To minimize (or reduce) the size of the non-display area in a plan view, the flexible display panel is curved in the display area or the non-display area in a direction opposite to a direction in which the image is displayed. Cracks may occur in the line parts when the flexible display panel is curved.

SUMMARY

An aspect of an embodiment of the present disclosure provides a flexible display device capable of reducing defects therein.

According to embodiments of the present disclosure a flexible display device includes a flexible display panel including a folding area and a peripheral area, and a first outer member on a surface of the flexible display panel and including a first groove pattern at the folding area. In some embodiments, the groove pattern is at one or more positions at the folding area as first groove patterns to fold the flexible display panel. The flexible display panel may be folded in the same (or substantially the same) direction or different directions at the folding areas.

The flexible display panel may have a rectangular shape having a pair of long sides and a pair of short sides and the folding area may extend along at least one edge of the flexible display panel. The flexible display panel may be folded at the folding area along one direction at an angle of about 180 degrees.

The first outer member may be under the flexible display panel and includes the first groove pattern at the folding area.

The first groove pattern includes a flat surface and inclined portions connected to the flat surface and symmetrical with each other about the flat surface. In some embodiments, each of the inclined portions includes an inclined surface that forms an obtuse angle with the flat surface. A width of the first groove pattern satisfies the Formula $W=F+2\times S=\pi\times R$, where W denotes the width of the first groove pattern, F denotes a width of the flat surface, S denotes a width of each of the inclined portions, $\pi$ denotes a circular constant, and R denotes a radius of curvature at the folding area. In some embodiments, the width of the first groove pattern is equal to a sum of the width of the flat surface and the widths of the inclined portions. The width of each of the inclined portions may be about 0.1 mm to about 3 mm.

In some embodiments, each of the inclined portions includes a plurality of inclined surfaces, and a respective angle between each of the plurality of the inclined surfaces and the flat surface become greater as the inclined surfaces are farther from the flat surface. In some embodiments, the respective angle between each of the plurality of the inclined surfaces and the flat surface is greater than about 90 degrees.

In some embodiments, each of the inclined portions includes a step pattern including a plurality of stepped portions. Each of the inclined portions may include at least two stepped portions to extend away from the flat surface. Each of the stepped portions may have a width of about 0.001 mm to about 3 mm.

In some embodiments, the flexible display device further includes a second outer member on an other surface of the flexible display panel and facing the first outer member. The second outer member may include a second groove pattern at the folding area.

The second outer member may be symmetrical with the first groove pattern with respect to the flexible display panel at the folding area. In some embodiments, the first groove pattern is at the folding area and the second groove pattern is at an other folding area, and the folding area and the other folding area are at different locations. In some embodiments, the flexible display panel is folded in different directions at the folding area and the other folding area.

The first groove pattern and the second groove pattern may have the same (or substantially the same) shape or different shapes. The first groove pattern and the second groove pattern may have the same (or substantially the same) width or different widths. According to some embodiments, the folding degree of the flexible display panel DP may be adjusted (or varied).

According to the above, the signal lines may be prevented from being cracked (or an amount or likelihood of cracking may be reduced) even though the flexible display panel is folded.

BRIEF DESCRIPTION OF THE DRAWINGS

The above and other advantages of the present disclosure will become readily apparent by reference to the following detailed description when considered in conjunction with the accompanying drawings, in which:

FIG. 6B is a cross-sectional view showing the flexible display device of

FIG. 6A in a folded configuration;

DETAILED DESCRIPTION

It will be understood that, in the context of the present application, when an element or layer is referred to as being "on", "connected to" or "coupled to" another element or layer, it can be directly on, connected to or coupled to the other element or layer or be indirectly on, connected to or coupled to other element or layer with one or more intervening elements or layers present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be referred to as a second element, component, region, layer or section without departing from the spirit and scope of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may also be otherwise oriented (e.g., rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, operations, elements, and/or components, but do not preclude the presence or addition of one or more other features, integers, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, certain embodiments of the present invention will be explained with reference to the accompanying drawings. As those skill in the art would recognize, the invention may be embodied in many different forms and should not be construed as being limited to the embodiments set forth herein.

Figure 1:
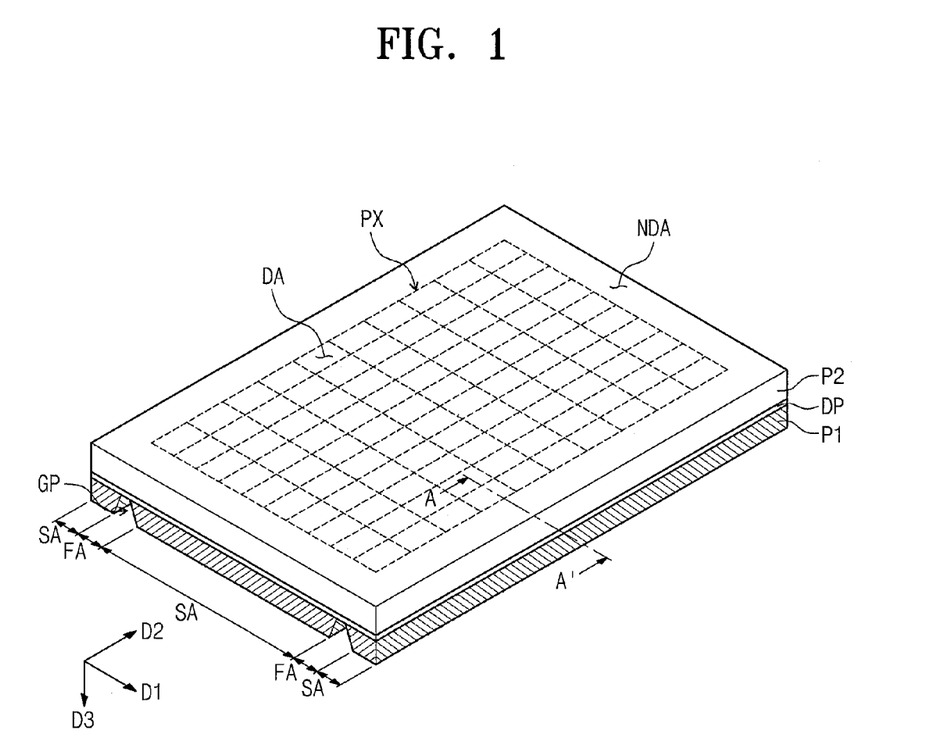
FIG. 1 is a perspective view showing a flexible display device according to an example embodiment of the present disclosure.

FIG. 1 is a perspective view showing a flexible display device according to an example embodiment of the present disclosure.

Referring to FIG. 1, the flexible display device includes a flexible display panel DP, a first outer member P1 on a surface of the flexible display panel DP, and a second outer member P2 on an other surface of the flexible display panel DP.

For convenience of explanation, a direction in which an image is displayed by the display device is referred to as an upper direction and a direction opposite to the upper direction is referred to as a lower direction, but the present disclosure is not limited thereto or thereby.

The flexible display panel DP displays the image. The flexible display panel DP may be an organic light emitting display panel or a plasma display panel, but the present disclosure is not limited thereto or thereby. That is, the flexible display panel DP may be a liquid crystal display panel, an electrowetting display panel, an electrophoretic display panel, or a microelectromechanical (MEMS) display panel. In the present example embodiment, the flexible display panel DP will be described as an organic light emitting display panel as a representative example.

The flexible display panel DP includes a display area DA in which the image is displayed and a non-display area NDA at a position adjacent to at least one side of the display area DA.

The flexible display panel DP includes a flexible substrate, signal lines on the flexible substrate, and pixels PX electrically connected to the signal lines. The pixels PX generate the image on the basis of the signals provided by the signal lines.

In the present embodiment, the flexible display panel DP has a rectangular shape having two pairs of sides, and each pair of sides includes two sides substantially parallel to each other. The sides of one pair of the two pairs are longer than the sides of the other pair of the two pairs. In the present example embodiment, the flexible display panel DP has the rectangular shape defined by a pair of long sides and a pair of short sides. A direction in which the short sides extend is referred to as a first direction D1, and a direction in which the long sides extend is referred to as a second direction D2.

The flexible display panel DP may be curved or wrapped to have a curved surface, or folded in a set (or specific) area thereof. The flexible display panel DP includes a folding area FA and a peripheral area SA in a plan view defined by the first direction D1 and the second direction D2. The folding areas FA correspond to areas each in which the flexible display panel DP is folded. The peripheral areas SA are each adjacent to a respective folding area FA.

FIG. 1 shows the flexible display panel DP including two folding areas FA and three peripheral areas SA, but the number of folding areas FA and the number of peripheral areas SA are not limited thereto or thereby. For example, at least one (or only one) folding area FA may be provided along at least one edge of the flexible display panel DP. In addition, the folding area FA may be provided at a center portion of the flexible display panel DP rather than at the edge of the flexible display panel DP, if desired.

The folding areas FA and the peripheral areas SA may include a portion of the pixels PX. The folding areas FA and the peripheral areas SA may display the image regardless of the areas being a folding area FA or a peripheral area SA. The peripheral areas SA may be flat or slightly curved.

The first outer member P1 is on the surface of the flexible display panel DP. In the present example embodiment, the first outer member P1 is under the flexible display panel DP. The first outer member P1 may include at least one of a polarizing plate or a protective member. In addition, two or more first outer members P1 may be on the surface of the flexible display panel DP. The first outer member P1 includes (e.g., is formed of) a flexible plastic (e.g., a flexible layer including a polymer).

The first outer member P1 includes a groove pattern GP formed at a position corresponding to the folding area FA. FIG. 1 shows two groove patterns GP respectively corresponding to two folding areas FA, but the number of the groove patterns GP is not limited to two. For example, the groove pattern GP may include a plurality (e.g., two or more) of groove patterns GP and the groove patterns GP may respectively correspond to the folding areas FA. In the case that a plurality of groove patterns GP are provided, the groove patterns GP may have the same (or substantially the same) shape or different shapes, and the groove patterns GP may have the same (or substantially the same) width or different widths.

The flexible display device may further include an adhesive member between the flexible display panel DP and the first outer member P1 to attach the flexible display panel DP and the first outer member P1 to one another.

The second outer member P2 is on the other surface of the flexible display panel DP to face the first outer member P1. In the present example embodiment, the second outer member P2 is on (or above) the flexible display panel DP. The second outer member P2 may include at least one of a polarizing plate, a touch screen, or a protective member. In addition, two or more second outer members P2 may be on the other surface of the flexible display panel DP. The second outer member P2 may further include a functional coating layer, e.g., an anti-fingerprint coating layer, an anti-reflection coating layer, etc. The second outer member P2 may be formed of a flexible plastic material (e.g., a flexible layer including a polymer).

The flexible display device may further include an adhesive member between the flexible display panel DP and the second outer member P2 to attach the flexible display panel DP and the second outer member P2 to one another.

Hereinafter, the flexible organic light emitting display panel will be described with reference to FIGS. 2 to 5. For convenience of explanation, only one pixel PX will be described as a representative example, but the flexible organic light emitting display panel is not limited to only one pixel PX.

Figure 2:
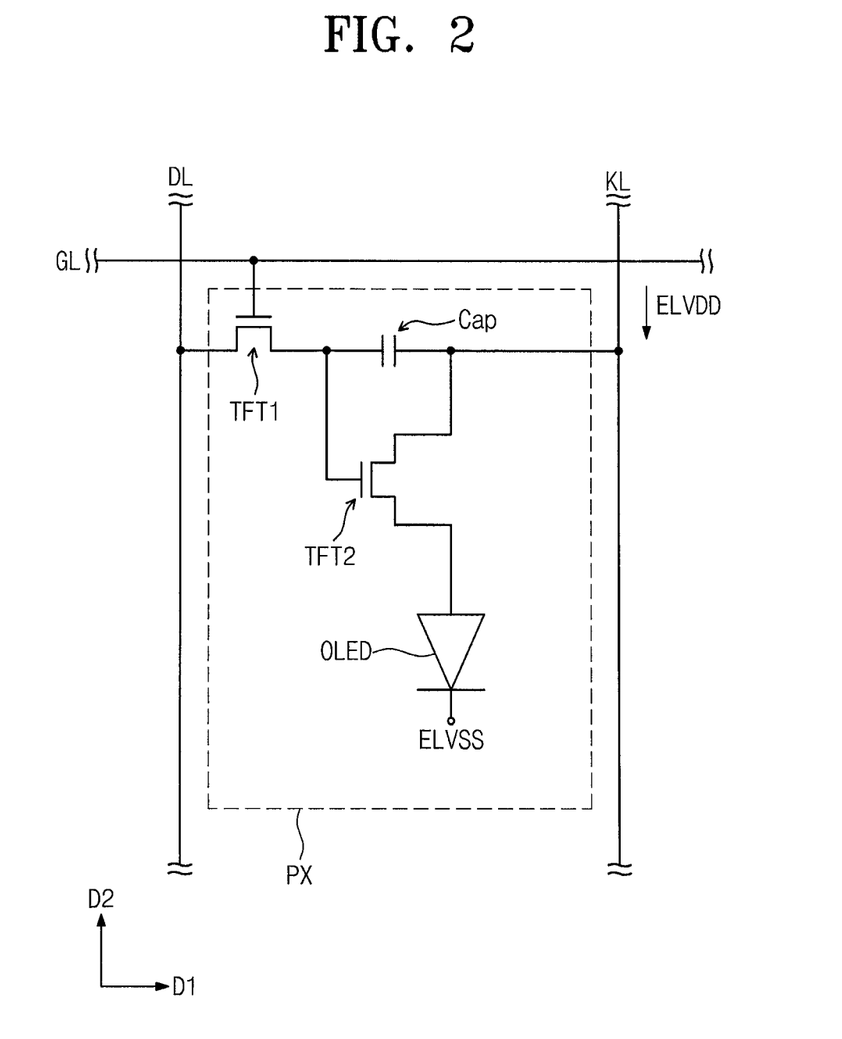
FIG. 2 is an equivalent circuit diagram showing one pixel of the flexible display device shown in FIG. 1.
Figure 3:
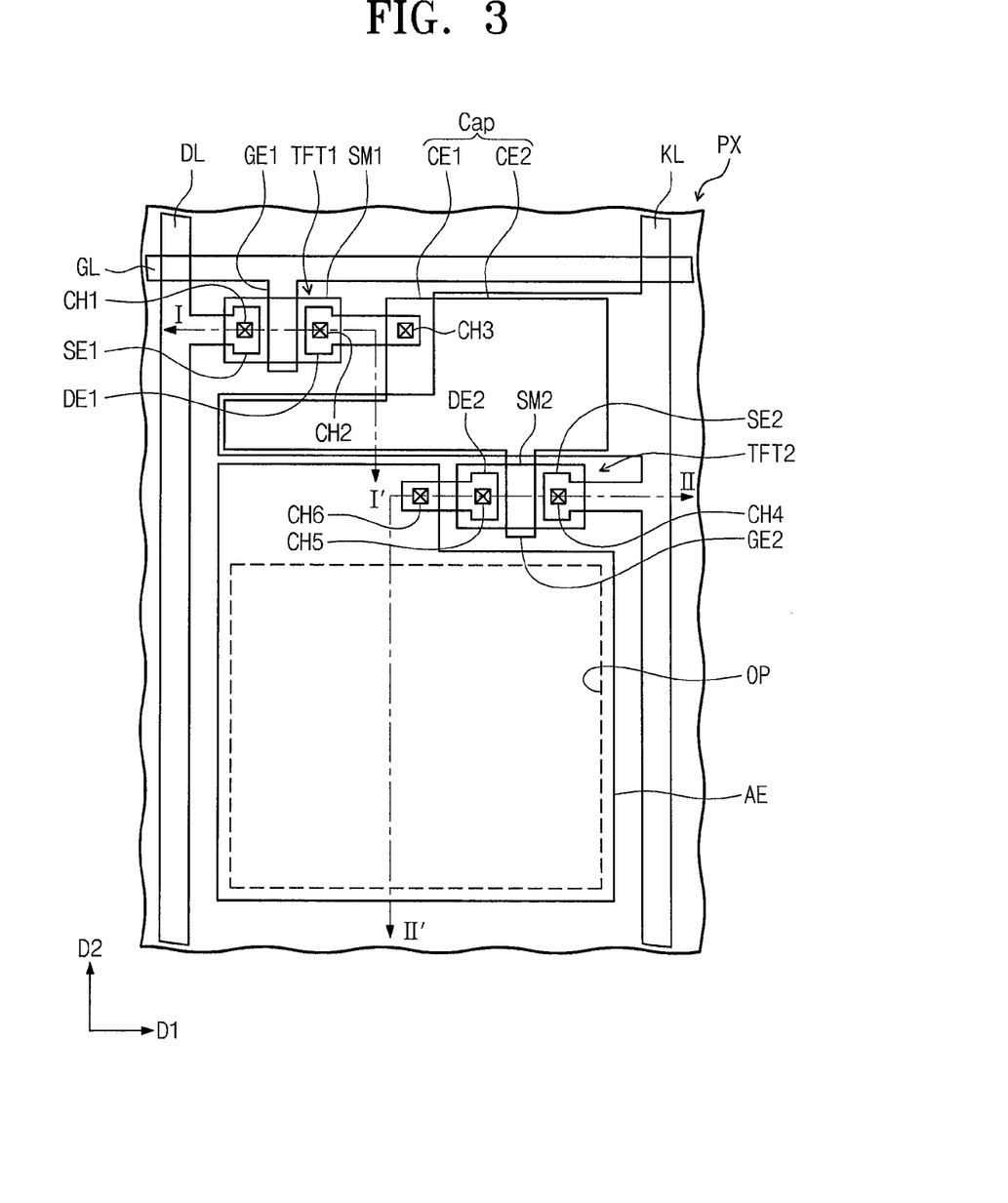
FIG. 3 is a plan view showing the one pixel of the flexible display device shown in FIG. 2.
Figure 4:
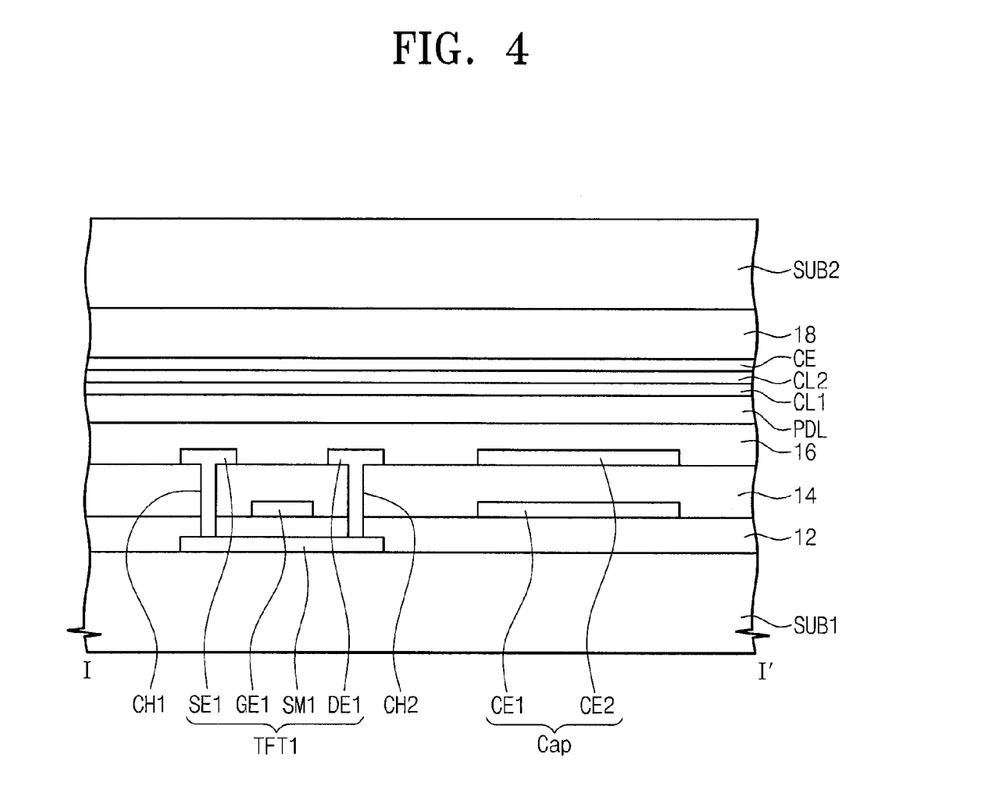
FIG. 4 is a cross-sectional view taken along a line I-I' of FIG. 3.
Figure 5:
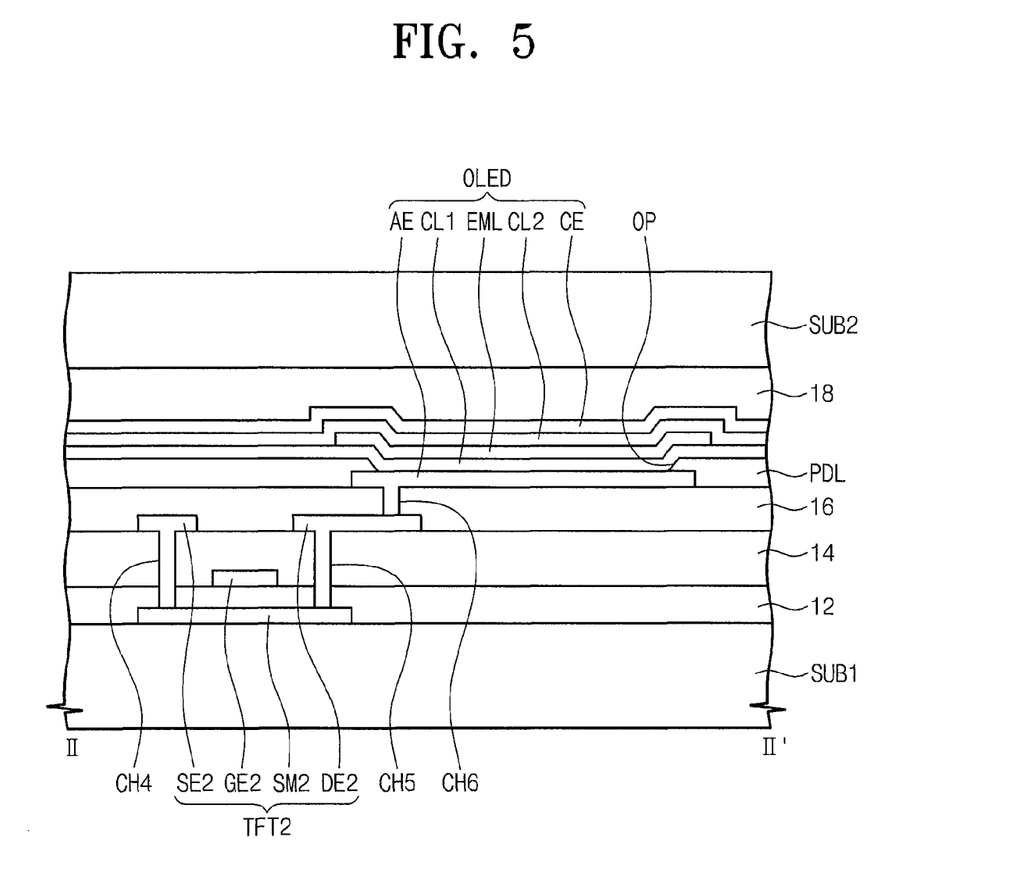
FIG. 5 is a cross-sectional view taken along a line II-II' of FIG. 3.

FIG. 2 is an equivalent circuit diagram showing one pixel of the flexible display device shown in FIG. 1, FIG. 3 is a plan view showing the one pixel of the flexible display device shown in FIG. 2, FIG. 4 is a cross-sectional view taken along a line I-I' of FIG. 3, and FIG. 5 is a cross-sectional view taken along a line II-II' of FIG. 3.

The flexible display panel DP includes a base substrate SUB1 that is flexible. The signal lines are on the base substrate SUB1. The flexible display panel DP further includes the pixel PX connected to the signal lines, and a sealing substrate SUB2 on the signal lines and the pixel PX.

The base substrate SUB1 includes (e.g., is formed of) a plastic material having high thermal resistance and high durability, such as polyethylene terephthalate (PET), polyethylene naphthalate (PEN), polycarbonate (PC), polyarylate (PAR), polyether imide (PEI), polyether sulfone (PES), polyimide (PI), etc., but the material for the base substrate SUB1 is not limited thereto or thereby.

The flexible display panel DP may further include a barrier layer on the base substrate SUB1. The barrier layer includes at least one of an organic layer or an inorganic layer. The barrier layer prevents foreign substances from entering into the display area DA after passing through the base substrate SUB1 (or reduces an amount or likelihood of such contamination).

The signal lines are on the base substrate SUB1 and include a gate line GL extending in the first direction D1, a data line DL extending in the second direction D2 crossing the first direction D1, and a power source line KL for receiving a first voltage ELVDD.

The pixel PX is connected to the gate line GL and the data line DL and includes a first thin film transistor TFT1, a second thin film transistor TFT2, a capacitor Cap, and an organic light emitting diode OLED. The first thin film transistor TFT1, the capacitor Cap, and the second thin film transistor TFT2 form a circuit part to control the organic light emitting diode OLED.

The first thin film transistor TFT1 outputs a data signal applied to the data line DL in response to a gate signal applied to the gate line GL. The second thin film transistor TFT2 controls a driving current flowing to the organic light emitting diode OLED in response to an amount of electric charge charged in the capacitor Cap. The pixel PX receives the first voltage ELVDD and a second voltage ELVSS having a different voltage level from that of the first voltage ELVDD.

Hereinafter, a structure of the flexible display panel DP according to an example embodiment will be described.

A semiconductor pattern SM1 (hereinafter, referred to as a first semiconductor pattern) of the first thin film transistor TFT1 and a semiconductor pattern SM2 (hereinafter, referred to as a second semiconductor patter) of the second thin film transistor TFT2 are on the base substrate SUB1. A first insulating layer 12 is on the base substrate SUB1 and covers the first semiconductor pattern SM1 and the second semiconductor pattern SM2. The first insulating layer 12 includes an organic and/or inorganic layer. The first insulating layer 12 may include a plurality of thin film layers.

A control electrode GE1 (hereinafter, referred to as a first control electrode) of the first thin film transistor TFT1 and a control electrode GE2 (hereinafter, referred to as a second control electrode) of the second thin film transistor TFT2 are on the first insulating layer 12. A first electrode CE1 of the capacitor Cap is on the first insulating layer 12.

A second insulating layer 14 is on the first insulating layer 12 and covers the first control electrode GE1, the second control electrode GE2, and the first electrode CE1. The second insulating layer 14 includes an organic and/or inorganic layer. The second insulating layer 14 may include a plurality of thin film layers.

An input electrode SE1 (hereinafter, referred to as a first input electrode) and an output electrode DE1 (hereinafter, referred to as a first output electrode) of the first thin film transistor TFT1 are on the second insulating layer 14. An input electrode SE2 (hereinafter, referred to as a second input electrode) and an output electrode DE2 (hereinafter, referred to as a second output electrode) of the second thin film transistor TFT2 are on the second insulating layer 14. The second input electrode SE2 is connected to the power source line KL. A second electrode CE2 of the capacitor Cap is on the second insulating layer 14.

The first input electrode SE1 and the first output electrode DE1 are connected to the first semiconductor pattern SM1 through first and second contact holes CH1 and CH2, respectively, which are formed through the first insulating layer 12 and the second insulating layer 14. The first output electrode DE1 is connected to the first electrode CE1 of the capacitor Cap through a third contact hole CH3 formed through the second insulating layer 14. The second input electrode SE2 and the second output electrode DE2 are connected to the second semiconductor pattern SM2 through fourth and fifth contact holes CH4 and CH5, respectively, which are formed through the first insulating layer 12 and the second insulating layer 14. The pixel PX is not limited to the configurations shown in FIGS. 2 to 5. For example, according to another embodiment, each of the first and second thin film transistors TFT1 and TFT2 may have a bottom gate structure.

A third insulating layer 16 is on the second insulating layer 14 and covers the first input electrode SE1, the first output electrode DE1, the second input electrode SE2, and the second output electrode DE2. The third insulating layer 16 includes an organic and/or inorganic layer. The third insulating layer 16 may include a plurality of thin film layers.

A pixel definition layer PDL and the organic light emitting diode OLED are on the third insulating layer 16. The organic light emitting diode OLED includes an anode AE, a first common layer CL1, an organic light emitting layer EML, a second common layer CL2, and a cathode CE, which are sequentially stacked on one another. The anode AE is connected to the second output electrode DE2 through a sixth contact hole CH6 formed through the third insulating layer 16. Positions of the anode AE and the cathode CE may be changed (or reversed) with respect to each other in accordance with a direction to which the organic light emitting diode OLED is configured to emit light.

The anode AE is on the third insulating layer 16 and exposed through an opening OP of the pixel definition layer PDL. The first common layer CL1 is on the anode AE. The first common layer CL1 is not only located in the light emitting area corresponding to the opening OP but also in the non-light emitting area. For example, the first common layer CL1 is over (or covers) the entire surface of the base substrate SUB1. The first common layer CL1 includes a hole injection layer. The first common layer CL1 may further include a hole transport layer.

The organic light emitting layer EML is on the first common layer CL1. In some embodiments, the organic light emitting layer EML is located only (or substantially only) in the area corresponding to the opening OP. The second common layer CL2 is on the organic light emitting layer EML. Similarly to the first common layer CL1, the second common layer CL2 is over (or covers) the entire surface of the base substrate SUB1. The second common layer CL2 includes an electron injection layer. The second common layer CL2 may further include an electron transport layer. The cathode CE is on the second common layer CL2. The cathode CE is over (or covers) the entire surface of the base substrate SUB1.

A fourth insulating layer 18 is on the cathode CE. The fourth insulating layer 18 includes an organic and/or inorganic layer. The fourth insulating layer 18 may include a plurality of thin film layers. The sealing substrate SUB2 is on the fourth insulating layer 18. The sealing substrate SUB2 may be a flexible plastic substrate (e.g., a flexible layer including a polymer). The sealing substrate SUB2 may be replaced with a sealing thin film layer.

Figure 6A:
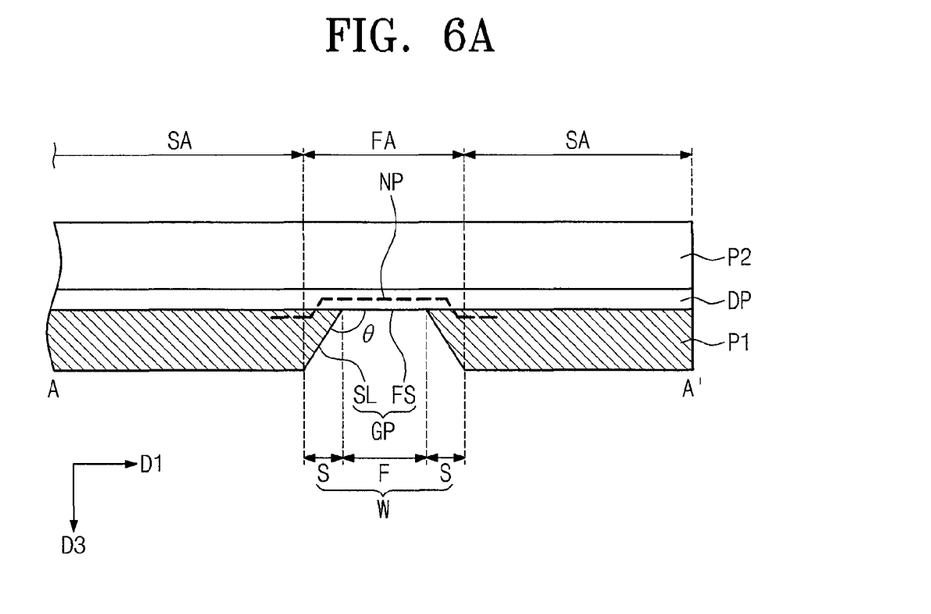
FIG. 6A is a cross-sectional view taken along a line A-A' of FIG. 1.
Figure 6B:
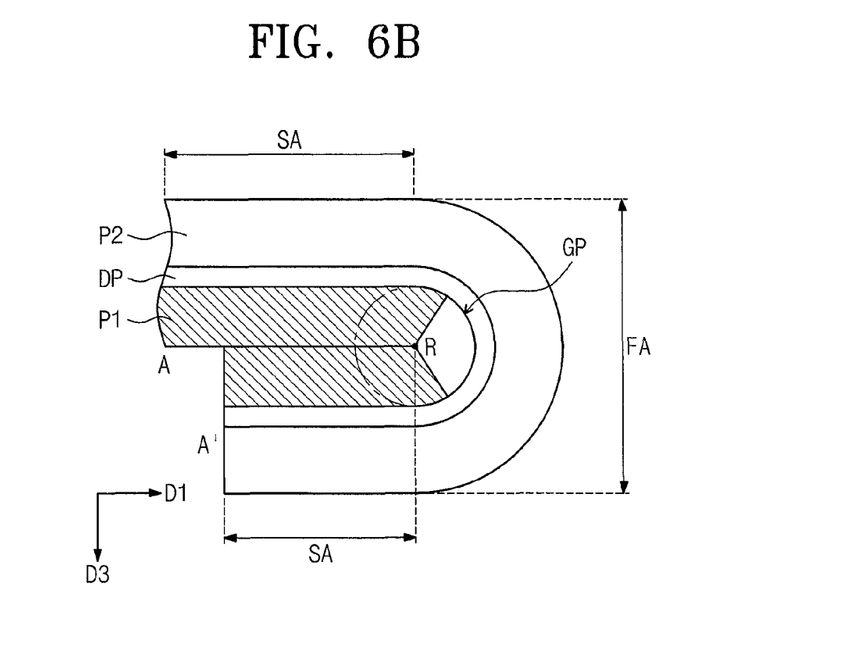

FIG. 6A is a cross-sectional view taken along a line A-A' of FIG. 1 and FIG. 6B is a cross-sectional view showing the flexible display device of FIG. 6A in a folded configuration.

Hereinafter, the flexible display panel according to the present example embodiment of the present disclosure will be described with reference to FIGS. 6A and 6B. For convenience of explanation, the first outer member P1 will be mainly described.

Referring to FIG. 6A, the first outer member P1 is under the flexible display panel DP and includes the groove pattern GP formed at the position corresponding to the folding area FA.

The groove pattern GP includes a flat surface FS and inclined portions SL, which are symmetrical with each other about the flat surface FS. The flat surface FS is defined (or provided) by removing a portion of the first outer member P1 or by minimizing (or reducing) a thickness of the first outer member P1. Each of the inclined portions SL includes an inclined surface that forms an obtuse angle 6 with the flat surface FS. The inclined portions SL become farther from the flat surface FS as they extend toward a third direction D3 in which the inclined portions SL become farther from the flexible display panel DP (e.g., the inclined portions SL angle away from the flat surface FS). A width W of the groove pattern GP satisfies the following Formula 1.

$$W = F + 2 \times S = \pi \times R \quad \text{Formula 1}$$

In Formula 1, "F" denotes a width (hereinafter, referred to as a first width) of the flat surface FS, "S" denotes a width (hereinafter, referred to as a second width) of each inclined portion SL, "π" denotes a circular constant (e.g., a ratio of a circumference of a circle to a diameter of the circle), and "R" denotes a radius of curvature in the folding area FA. The width W of the groove pattern GP is equal to a sum of the first width F and the second widths S. For example, in the present example embodiment, the second width S may be about 0.1 mm to about 3 mm. The width W of the groove pattern GP is changed (or adjusted) depending on the radius of curvature R. In addition, the first width F and the second width S are adjusted (or varied) depending on the radius of curvature R.

The flexible display device according to the present example embodiment is folded (e.g., folded over) about 180 degrees in (e.g., through) the third direction D3, and thus the peripheral areas SA at both sides of the folding area FA are overlapped with each other.

When an external force is applied to the flexible display device according to the present example embodiment in order to fold the flexible display device, the second outer member P2 at an outer side of the folding area FA is applied (or loaded) with a tensile stress and the first outer member P1 at an inner side of the folding area FA is applied (or loaded) with a compression stress. In this case, a neutral plane NP, in which no (or substantially no) tensile stress or compression stress occurs (or is present), exists between the first outer member P1 and the second outer member P2. When the neutral plane NP is at the flexible display panel DP, the stress applied to the flexible display panel DP is reduced, and thus the flexible display panel DP may be prevented from being damaged while being folded (or an amount or likelihood of such damage may be reduced). Accordingly, the groove pattern GP is formed in the folding area FA of the first outer member P1 in order to remove or reduce the compression stress applied to the first outer member P1. When the flexible display device is folded, the groove pattern GP is located at a position at which the compression stress is increased (or is at a maximum) in the folding area FA. For example, because the neutral plane NP gradually moves to the flexible display panel DP from the first outer member P1 due to the groove pattern GP being at the folding area FA, the signal lines may be prevented from being cracked (or an amount or likelihood of such cracking may be reduced) even though the flexible display panel DP is folded.

FIGS. 7 to 10 are cross-sectional views showing flexible display devices according to example embodiments of the present disclosure. Hereinafter, various groove patterns will be described with reference to FIGS. 7 to 10. For convenience of explanation, the same elements will be assigned the same reference numerals, and thus detailed descriptions of the same elements will be omitted (e.g., not provided).

Figure 7:
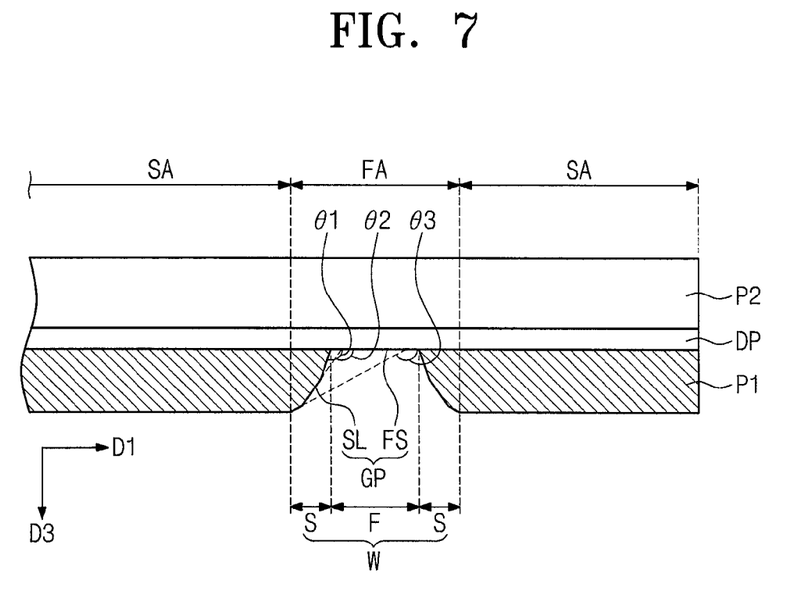
FIGS. 7 to 10 are cross-sectional views showing flexible display devices according to example embodiments of the present disclosure.

FIG. 7 is a cross-sectional view showing a flexible display device according to another example embodiment of the present disclosure.

Referring to FIG. 7, the first outer member P1 is under the flexible display panel DP and includes a groove pattern GP at (e.g., formed in) the folding area FA.

The groove pattern GP includes a flat surface FS and inclined portions SL connected to the flat surface FS and symmetrical with each other about the flat surface FS. The flat surface FS is defined (or provided) by removing a portion of the first outer member P1 or by minimizing (or reducing) a thickness of the first outer member P1. Each of the inclined portions SL includes inclined surfaces that form first, second, and third angles $\theta1$, $\theta2$, and $\theta3$, respectively, with the flat surface FS. The first, second, and third angles $\theta1$, $\theta2$, and $\theta3$ are greater than about 90 degrees. The inclined surfaces become farther from the flat surface FS as they extend toward the third direction D3 in which the inclined portions SL become farther from the flexible display panel DP (e.g., the inclined portions SL angle away from the flat surface FS). For example, the first, second, and third angles $\theta1$, $\theta2$, and $\theta3$ satisfy the following Formula 2.

$$90° \leq \theta1 \leq \theta2 \leq \theta3 < 180° \qquad \text{Formula 2}$$

Here, each of the inclined portions SL includes three inclined surfaces that form the first, second, and third angles $\theta1$, $\theta2$, and $\theta3$, respectively, with the flat surface FS, but the inclined portions SL are not limited thereto or thereby. For example, each of the inclined portions SL may include at least two inclined surfaces.

A width W of the groove pattern GP is equal to a sum of a width F (hereinafter, referred to as a first width) and widths S (hereinafter, referred to as second widths) of the inclined portions SL. In the present example embodiment, each second width S may be about 0.1 mm to about 3 mm. The width W of the groove pattern GP may be changed (or adjusted) depending on the radius of curvature R in the folding area FA when the flexible display device is folded. In addition, due to the radius of curvature R, the first width F and the second widths S may be adjusted (or varied).

Figure 8:
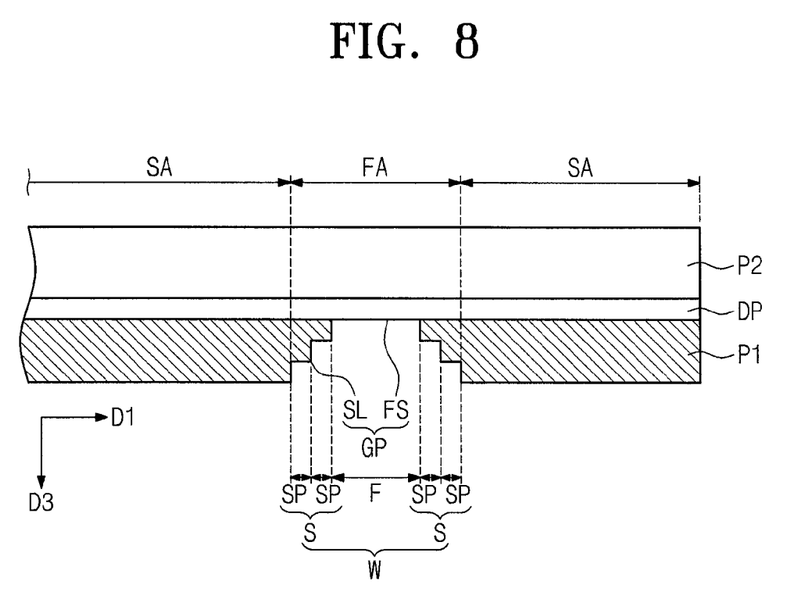

FIG. 8 is a cross-sectional view showing a flexible display device according to another example embodiment of the present disclosure.

Referring to FIG. 8, the first outer member P1 is under the flexible display panel DP and includes a groove pattern GP at (e.g., formed in) the folding area FA.

The groove pattern GP includes a flat surface FS and inclined portions SL connected to the flat surface FS and symmetrical with each other about the flat surface FS. The flat surface FS is defined (or provided) by removing a portion of the first outer member P1 or by minimizing (or reducing) a thickness of the first outer member P1.

Each of the inclined portions SL has a step pattern including (or defined by) stepped portions. Each of the inclined portions SL includes at least two stepped portions to extend away from the flat surface FS. A width W of the groove pattern GP satisfies the following Formula 3.

$$W = F + 2 \times S = F + 2 \times n \times (SP) = \pi \times R \qquad \text{Formula 3}$$

In Formula 3, "F" denotes a width (hereinafter, referred to as a first width) of the flat surface FS, "S" denotes a width (hereinafter, referred to as a second width) of each inclined portion SL, "n" denotes the number of the stepped portions, "SP" denotes a width (hereinafter, referred to as a third width) of the stepped portion, "$\pi$" denotes a circular constant (e.g., a ratio of a circumference of a circle to a diameter of the circle), and "R" denotes a radius of curvature in the folding area FA.

The width W of the groove pattern GP is equal to a sum of the first width F and the second widths S. In the present example embodiment, the second width S may be about 0.1 mm to about 3 mm. The third width SP may be about 0.001 mm to about 3 mm. The width W of the groove pattern GP may be changed (or adjusted) depending on the radius of curvature R. In addition, the first width F and the second width S may be adjusted (or varied) depending on the radius of curvature R.

Figure 9:
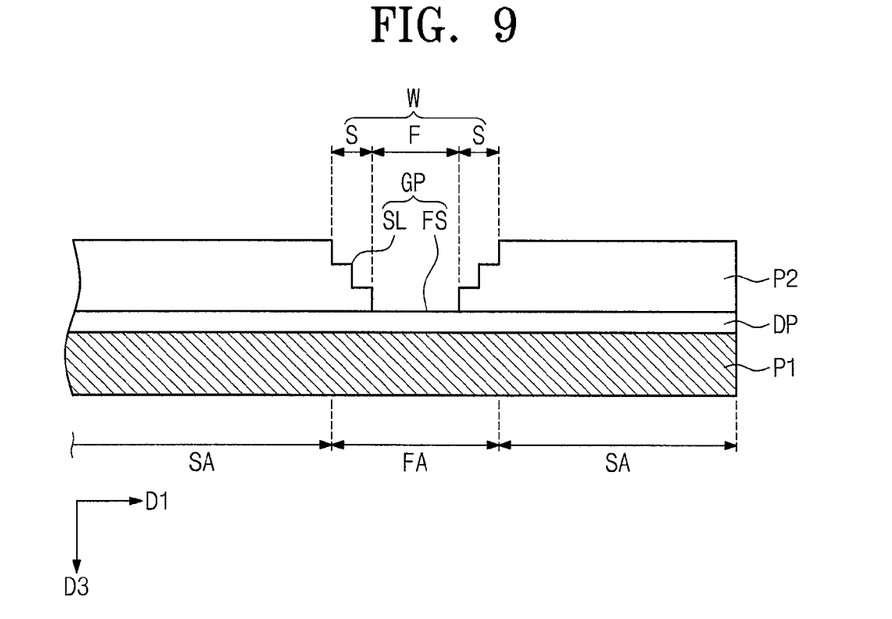

FIG. 9 is a cross-sectional view showing a flexible display device according to another example embodiment of the present disclosure.

Referring to FIG. 9, the second outer member P2 is on the flexible display panel DP and includes a groove pattern GP at (e.g., formed in) the folding area FA.

The groove pattern GP includes a flat surface FS and inclined portions SL connected to the flat surface FS and symmetrical with each other about the flat surface FS.

The flat surface FS is defined (or provided) by removing a portion of the second outer member P2 or by minimizing (or reducing) a thickness of the second outer member P2. Each of the inclined portions SL has a step pattern including (or defined by) stepped portions. Each of the inclined portions SL includes at least two stepped portions to extend away from the flat surface FS.

The width W of the groove pattern GP is equal to a sum of the width F of the flat surface FS and the widths S of the inclined portions SL. The width W of the groove pattern GP may be changed (or adjusted) depending on the radius of curvature R. In addition, the width F of the flat surface FS and the widths S of the inclined portions SL may be adjusted (or varied) depending on the radius of curvature R.

Here, when an external force is applied to the flexible display device in order to fold the flexible display device in (or through) the direction opposite to the third direction D3, the first outer member P1 at an outer side of the folding area FA is applied (or loaded) with a tensile stress and the second outer member P2 at an inner side of the folding area FA is applied (or loaded) with a compression stress. Accordingly, the groove pattern GP is at (e.g., formed in) the folding area FA of the second outer member P2 in order to remove or reduce the compression stress applied to the second outer member P2. When the flexible display device is folded, the groove pattern GP is located at a position at which the compression stress is increased (or is at a maximum) in the folding area FA.

Figure 10:
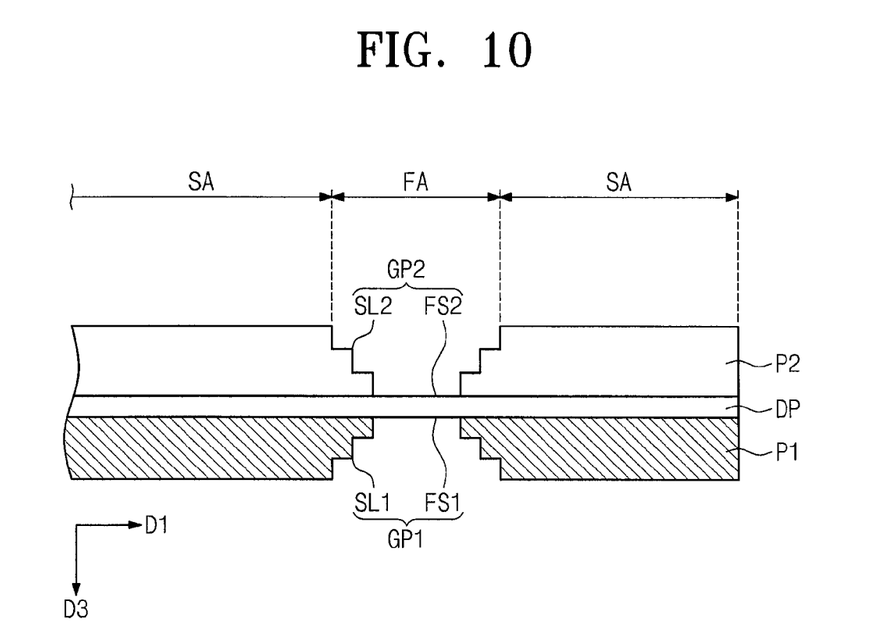

FIG. 10 is a cross-sectional view showing a flexible display device according to another example embodiment of the present disclosure.

Referring to FIG. 10, the first outer member P1 is under the flexible display panel DP and includes a first groove pattern GP1 at (e.g., formed in) the folding area FA. The second outer member P2 is on the flexible display panel DP and includes a second groove pattern GP2 at (e.g., formed in) the folding area FA.

The first groove pattern GP1 includes a first flat surface FS1 and first inclined portions SL1 connected to the first flat surface FS1 and symmetrical with each other about the first flat surface FS1. The first flat surface FS1 is defined (or provided) by removing a portion of the first outer member P1 or by minimizing (or reducing) a thickness of the first outer member P1. Each of the first inclined portions SL1 has a step pattern including (or defined by) stepped portions. Each of the first inclined portions SL1 includes at least two stepped portions to extend away from the first flat surface FS1.

The second groove pattern GP2 includes a second flat surface FS2 and second inclined portions SL2 connected to the second flat surface FS2 and symmetrical with each other about the second flat surface FS2. The second flat surface FS2 is defined (or provided) by removing a portion of the second outer member P2 or by minimizing (or reducing) a thickness of the second outer member P2.

Each of the second inclined portions SL2 has a step pattern including (or defined by) stepped portions. Each of the second inclined portions SL2 includes at least two stepped portions to extend away from the second flat surface FS2.

The first groove pattern GP1 and the second groove pattern GP2 are symmetrical with each other in the folding area FA with respect to the flexible display panel DP.

As described above, because the first groove pattern GP1 and the second groove pattern GP2 are at (e.g., formed in) the first outer member P1 and the second outer member P2, respectively, in the folding area FA, a neutral plane exists in the flexible display panel DP. Therefore, although the flexible display device is folded in (e.g., through) the third direction D3 or the direction opposite to the third direction D3, the stress applied to the flexible display panel DP is minimized (or reduced). Thus, the flexible display panel DP may be prevented from being damaged (or an amount or likelihood of damage may be reduced).

Figure 11:
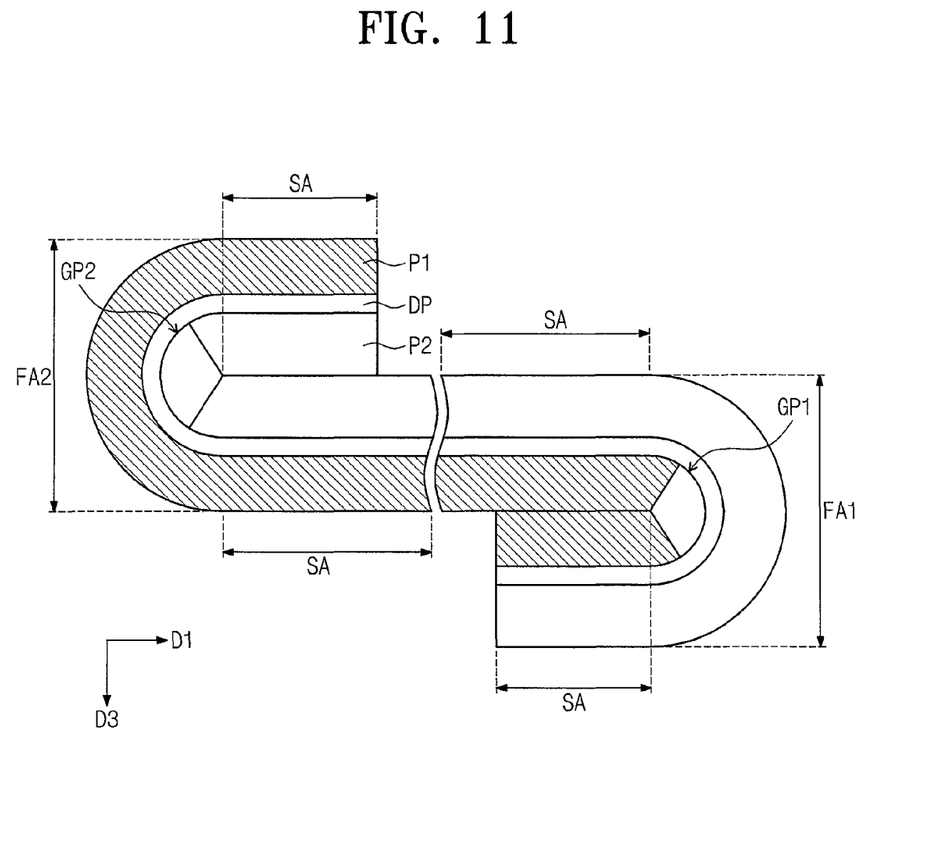
FIG. 11 is a cross-sectional view showing a flexible display device according to another example embodiment of the present disclosure that is in a folded configuration.

FIG. 11 is a cross-sectional view showing a flexible display device according to another example embodiment of the present disclosure that is in a folded configuration.

The flexible display device shown in FIG. 11 includes two folding areas FA1 and FA2 and four peripheral areas SA adjacent to the respective folding areas FA1 and FA2.

The flexible display device includes a flexible display panel DP, a first outer member P1 on one surface of the flexible display panel DP, and a second outer member P2 on an other surface of the flexible display panel DP.

The first outer member P1 is under the flexible display panel DP and includes a first groove pattern GP1 at (e.g., formed in) the first folding area FA1. The second outer member P2 is on the flexible display panel DP and includes a second groove pattern GP2 at (e.g., formed in) the second folding area FA2.

The flexible display panel DP is folded in (e.g., through) the third direction D3 in the first folding area FA1 and folded in (e.g., through) the direction opposite to the third direction D3 in the second folding area FA2. Here, the flexible display panel DP is folded at about 180 degrees, but the flexible display panel is not limited thereto or thereby. In addition, the first groove pattern GP1 and the second groove pattern GP2 have the same (or substantially the same) shape as shown in FIG. 11, but the first groove pattern GP1 and the second groove pattern GP2 may have different shapes corresponding to any of the embodiments disclosed herein. Further, the width of the first groove pattern GP1 may be different from the width of the second groove pattern GP2, and thus the folding degree of the flexible display panel DP may be adjusted (or varied).

Although certain embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A flexible display device comprising:
a flexible display panel comprising a folding area and a peripheral area; and
a first outer member on a surface of the flexible display panel and comprising a first groove pattern at the folding area,
wherein the first groove pattern comprises:
a flat surface; and
inclined portions connected to the flat surface and symmetrical with each other about the flat surface,
wherein a width of the first groove pattern satisfies the Formula $W=F+2\times S=\pi \times R$, and
wherein W denotes the width of the first groove pattern, F denotes a width of the flat surface, S denotes a width of each of the inclined portions, $\pi$ denotes a circular constant, and R denotes a radius of curvature of the flexible display panel at the folding area.

2. The flexible display device of claim 1, wherein the width of each of the inclined portions is about 0.1 mm to about 3 mm.

3. The flexible display device of claim 2, wherein each of the inclined portions comprises an inclined surface that forms an obtuse angle with the flat surface.

4. The flexible display device of claim 2, wherein each of the inclined portions comprises a plurality of inclined surfaces, and a respective angle between each of the plurality of the inclined surfaces and the flat surface become greater as the inclined surfaces are farther from the flat surface.

5. The flexible display device of claim 4, wherein the respective angle between each of the plurality of the inclined surfaces and the flat surface is greater than about 90 degrees.

6. The flexible display device of claim 1, wherein each of the inclined portions comprises a step pattern comprising a plurality of stepped portions.

7. The flexible display device of claim 6, wherein each of the stepped portions has a width of about 0.001 mm to about 3 mm.

8. The flexible display device of claim 7, wherein each of the inclined portions has a width of about 0.1 mm to about 3 mm.

9. The flexible display device of claim 1, wherein the flexible display panel has a rectangular shape and the folding area extends along at least one edge of the flexible display panel.

10. The flexible display device of claim 9, wherein the flexible display panel is folded at the folding area along one direction at an angle of about 180 degrees.

11. The flexible display device of claim 10, wherein the first groove pattern is at one or more positions at the folding area as first groove patterns.

12. The flexible display device of claim 11, wherein the first groove patterns have a same width.

13. The flexible display device of claim 11, wherein the first groove patterns have different widths.

14. The flexible display device of claim 1, further comprising a second outer member on an other surface of the flexible display panel and facing the first outer member, wherein the second outer member comprises a second groove pattern.

15. The flexible display device of claim 14, wherein the second groove pattern is symmetrical with the first groove pattern with respect to the flexible display panel.

16. The flexible display device of claim 14, wherein the first groove pattern is at the folding area and the second groove pattern is at an other folding area, and the folding area and the other folding area are at different locations.

17. The flexible display device of claim 16, wherein the flexible display panel is folded in different directions at the folding area and the other folding area.

* * * * *